United States Patent
Azeroual et al.

(10) Patent No.: US 12,295,094 B1
(45) Date of Patent: May 6, 2025

(54) PAD AND VIA PATTERN ARRANGEMENT FOR DIFFERENTIAL SIGNAL SHIELDING

(71) Applicant: Marvell Israel (M.I.S.L) Ltd., Yokne'am (IL)

(72) Inventors: Dan Azeroual, Kiryat Ata (IL); Liav Ben Artsi, Nahariya (IL); David Katz, Hadera (IL)

(73) Assignee: Marvell Israel (M.I.S.L) Ltd., Yokne'am (IL)

( * ) Notice: Subject to any disclaimer, the term of this patent is extended or adjusted under 35 U.S.C. 154(b) by 178 days.

(21) Appl. No.: 17/812,305

(22) Filed: Jul. 13, 2022

Related U.S. Application Data (60) Provisional application No. 63/221,417, filed on Jul. 13, 2021.

(51) Int. Cl.
*H05K 1/02* (2006.01)
*H05K 1/11* (2006.01)

(52) U.S. Cl.
CPC ......... *H05K 1/0245* (2013.01); *H05K 1/0216* (2013.01); *H05K 1/111* (2013.01); *H05K 1/0222* (2013.01); *H05K 1/11* (2013.01)

(58) Field of Classification Search
CPC ..... H05K 1/0245; H05K 1/0216; H05K 1/111
See application file for complete search history.

(56) References Cited

U.S. PATENT DOCUMENTS

| | | | | |
|---|---|---|---|---|
| 6,833,513 B1* | 12/2004 | Ahmad | ................ | H05K 1/0219 174/262 |
| 10,522,949 B1* | 12/2019 | Loffink | ............. | H01R 13/6471 |
| 2009/0188711 A1* | 7/2009 | Ahmad | ................ | H05K 1/0248 174/262 |
| 2014/0140027 A1* | 5/2014 | Enriquez Shibayama | ................... | H05K 1/0228 174/250 |
| 2016/0181682 A1* | 6/2016 | Zhao | ...................... | H05K 1/111 333/5 |

* cited by examiner

*Primary Examiner* — Ishwarbhai B Patel (57) ABSTRACT

A printed circuit board (PCB) is provided herein, including signal and ground pads on a surface of the PCB. The signal pads are grouped into differential signal pad pairs, where each differential signal pad pair has a midpoint located halfway between the centers of the signal pads of the differential signal pad pair. A first differential signal pad pair is positioned on a first line, which intersects with both centers of the signal pads of the first differential signal pad pair. A second differential signal pad pair is positioned on a second line, which intersects with the centers of the signal pads of the second differential signal pad pair, parallel to the first line. Additionally, at least one ground pad is positioned along a line drawn from a midpoint of the first differential signal pad pair and a midpoint of the second differential signal pad pair.

16 Claims, 7 Drawing Sheets

PAD AND VIA PATTERN ARRANGEMENT FOR DIFFERENTIAL SIGNAL SHIELDING

CROSS REFERENCE TO RELATED APPLICATION

This disclosure claims the benefit of commonly-assigned U.S. Provisional Patent Application No. 63/221,417, filed Jul. 13, 2021, which is hereby incorporated by reference herein in its entirety.

FIELD OF USE

This disclosure relates to a printed circuit board (PCB) and/or package ball arrangement. More particularly, this disclosure relates to a printed circuit board with a pattern arrangement of differential signal pad pairs, a pattern arrangement of ground pads, and layout pattern arrangements, that reduce lane-to-lane cross-talk and break-out discontinuity, and the arrangement of pads dictates a corresponding package ball arrangement.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the subject matter of the present disclosure.

Printed circuit boards (PCBs) typically have connection points, commonly referred to as pads, in order to electrically couple to devices such as integrated circuits or additional PCBs. A pad may refer to either a land or a plated signal through-hole. In some embodiments, a plated through-hole is a hole that extends completely through the PCB with conductive plating around the perimeter of corresponding holes of the plated through-hole on each side of the PCB. As the distances between the centers of pads, referred to as "pad pitch," become smaller, the possibility of cross-talk or interference between pads increases. This may be of particular concern in the case of high-speed differential signals with a data rate of around 100 Gbps. The alternative of spacing pads in the pad pairs further apart may not be desirable, because it would result in either a larger PCB size or a reduced number of pads that can be accommodated on the PCB or package ball arrangement.

SUMMARY

A printed circuit board having a major plane, including a first plurality of signal pads, each signal pad in the first plurality of signal pads being on a surface of the printed circuit board that is parallel to the major plane, the first plurality of signal pads being grouped into a second plurality of differential signal pad pairs, wherein each respective differential signal pad pair defines a midpoint that is located halfway between centers of the signal pads of the respective differential signal pad pair, a first differential signal pad pair positioned on a first line, wherein a line drawn between the centers of the signal pads of the first differential signal pad pair is coincident with the first line, a second differential signal pad pair positioned on a second line parallel to the first line, wherein a line drawn between the centers of the signal pads of the second differential signal pad pair is coincident with the second line, a plurality of ground pads on the surface of the printed circuit board, wherein a first subset of the plurality of ground pads are distributed along a ground pad line that is parallel to the first line and positioned between the first line and the second line, and at least one of the ground pads is positioned along a line drawn from a midpoint of the first differential signal pad pair and a midpoint of the second differential signal pad pair.

In a first implementation of such a printed circuit board, wherein the ground pad line is positioned halfway between the first line and the second line and the at least one of the ground pads is positioned halfway along the line drawn from the midpoint of the first differential signal pad pair and the midpoint of the second differential signal pad pair.

In a second implementation of such a printed circuit board, wherein the second plurality of differential signal pad pairs includes a first linear arrangement of differential signal pad pairs, including the first differential signal pad pair, distributed along the first line and a second linear arrangement of differential signal pad pairs, including the second differential signal pad pair, distributed along the second line, wherein in the first linear arrangement, differential signal pad pairs are uniformly distributed along the first line, adjacent differential signal pad pairs of the first linear arrangement of differential signal pad pairs being separated by a first pair-to-pair pitch measured between midpoints of the adjacent differential signal pad pairs of the first linear arrangement of differential signal pad pairs, and in the second linear arrangement, differential signal pad pairs are uniformly distributed along the second line, adjacent differential signal pad pairs of the second linear arrangement of differential signal pad pairs being separated by a second pair-to-pair pitch measured between midpoints of adjacent differential signal pad pairs of the second arrangement of differential signal pad pairs, wherein the second pair-to-pair pitch is the same as the first pair-to-pair pitch.

A first aspect of that second implementation of such a printed circuit board, wherein the differential signal pad pairs of the second linear arrangement are offset from the differential signal pad pairs of the first linear arrangement, such that a line drawn normal to the first line and extending from the midpoint of a differential signal pad pair of the second linear arrangement intersects the first line halfway between two differential signal pad pairs.

In a first instance of that first aspect, wherein each differential signal pad pair in the second plurality of differential signal pad pairs includes a positive signal pad and a negative signal pad.

In a second instance of that first aspect, wherein each of the signal pads is one of a signal land or a plated signal through-hole and each of the ground pads is one of a ground land or a plated ground through-hole.

In a first variant of that second instance, wherein the second plurality of differential signal pad pairs further includes a third linear arrangement of differential signal pad pairs distributed along a third line parallel to the first line and the second line, the differential signal pad pairs in the third linear arrangement of differential signal pad pairs being uniformly distributed such that a respective line drawn normal to the first line from a midpoint of a respective differential signal pad pair of the third linear arrangement intersects with a midpoint of a respective differential signal pad pair of the first linear arrangement of differential signal pad pairs.

In a first configuration of that first variant, further including additional linear arrangements of differential signal pad pairs, wherein each additional linear arrangement of differential signal pad pairs is distributed along an additional line, and for each respective additional linear arrangement, the differential signal pad pairs in that respective additional arrangement are positioned such that a respective line drawn from the midpoint of a respective differential signal pad pair of the respective additional linear arrangement, normal to a line along which an adjacent linear arrangement of differential signal pad pairs is distributed intersects with the line, along which the adjacent linear arrangement of differential signal pad pairs is distributed, halfway between two differential signal pad pairs of the adjacent linear arrangement of differential signal pad pairs.

In a third instance of that first aspect, wherein the plurality of ground pads further includes a subset of the plurality of ground pads, each ground pad of the subset being positioned halfway between the differential signal pad pairs of one of the linear arrangements of differential signal pad pairs.

In a first variant of that third instance, wherein ground pads in the plurality of ground pads surround each of the differential signal pad pairs in at least two spatial axes to shield against cross-talk between neighboring differential signal pad pairs.

In a first configuration of that first variant, further including a plurality of ground vias electrically coupled to a ground layer of the printed circuit board, wherein at least one of the plurality of ground pads is electrically coupled to at least one of the plurality of ground vias.

In a first composition of that first configuration, wherein for a respective linear arrangement of differential signal pad pairs, at least a first one of the plurality of ground vias is positioned between two adjacent differential signal pad pairs in the respective linear arrangement of differential signal pad pairs, and at least a second one of the plurality of ground vias is positioned between two adjacent linear arrangements of differential signal pad pairs; the printed circuit board further including differential signal traces routed through a lane provided by spacing between a linear arrangement of differential signal pad pairs and an adjacent linear arrangement of ground pads, parallel to the first line.

In a first variant of the first instance of the first aspect, further including a plurality of signal via pairs, each signal via pair including a positive signal via and a negative signal via, the plurality of signal via pairs separated from at least one layer of the printed circuit board by a plurality of via anti-pads.

In a first configuration of that first variant, wherein the positive signal pad of the at least one of the second plurality of differential signal pad pairs is electrically coupled to the positive signal via of the at least one plurality of signal via pairs and the negative signal pad of the at least one of the second plurality of differential signal pad pairs is electrically coupled to the negative signal via of the at least one plurality of signal via pairs.

In a second configuration of that first variant, further including a plurality of differential signal trace pairs, routed in at least one plane parallel to the major plane, wherein each differential signal trace pair in the plurality of differential signal trace pairs including a positive signal trace and a negative signal trace.

In a first composition of that first configuration, wherein for each respective differential signal pad pair in the second plurality of differential signal pad pairs, the positive signal pad is electrically coupled to the positive signal trace of a corresponding differential signal trace pair of the plurality of differential signal trace pairs by a positive signal via, and for each respective differential signal pad pair in the second plurality of differential signal pad pairs the negative signal pad is electrically coupled to the negative signal trace of a corresponding differential signal trace pair of the plurality of differential signal trace pairs by a negative signal via.

BRIEF DESCRIPTION OF THE DRAWINGS

Further features of the disclosure, its nature, and various advantages, will be apparent upon consideration of the following detailed description, taken in conjunction with the accompanying drawings, in which like reference characters refer to like parts throughout, and in which.

DETAILED DESCRIPTION

The possibility of cross-talk or interference between differential signal pad pairs increases as the pair-to-pair pitch—defined as the distance between the centerpoint of one pad pair and the centerpoint of a neighboring pad pair—becomes smaller. Therefore, the pad pairs may be more susceptible to inductive or conductive interference from neighboring pad pairs, altering the intended signal through each affected signal pad. Vias and traces of the PCB also may be vulnerable to cross-talk and signal interference.

Additionally, for differential signals with a data rate at or above 100 gigabits per second (Gbps), there is a greater likelihood for cross-talk or electronic interference than for lower-data-rate differential signals. Lane-to-lane crosstalk may include trace-to-trace cross-talk, via-to-via cross-talk or pad-to-pad crosstalk, and different combinations thereof. Impedance discontinuity of the vias and traces may occur when the electromagnetic fields of the vias or the electromagnetic fields of the traces are altered by electrical interference. The change in electromagnetic fields may result in a change of the electrical properties including inductance, impedance, and capacitance. Therefore, lane-to-lane crosstalk and breakout impedance discontinuity may be more of a concern when propagating a high-data-rate differential signal (e.g., at or above 100 Gbps) through the pads, vias and traces of a PCB.

Such interference may result in delays in signal transmissions or a glitch in the signal in the case of differential signal pad pairs. The pad pairs of a printed circuit board layout may be spaced further apart to avoid cross-talk, but increasing pad spacing is not a practical solution, because it would result in either a larger device size or a reduced number of pads that could be accommodated without increasing device size.

Therefore, in accordance with implementations of the subject matter of this disclosure, pairs of differential signal pads may be arranged in ways such that cross-talk between adjacent pad pairs, adjacent vias, and traces may be cancelled or reduced.

In implementations of the subject matter of this disclosure, differential signal pad pairs may be arranged in a pattern which includes linear arrangements of differential signal pad pairs. Each linear arrangement is distributed along a respective line. The various lines along with the different linear arrangements are distributed in parallel to one another. The differential signal pad pairs of a given linear arrangement are offset from the differential signal pad pairs of an adjacent linear arrangement, as described in more detail below. In addition, ground pads may be provided between the differential signal pad pairs to further reduce cross-talk and interference. Ground pads may be positioned in order to surround the differential signal pad pairs. In some implementations, for a given differential signal pad pair, a ground pad is positioned between the given differential signal pad pair and each neighboring differential signal pad pair. As a result, interference at any one pad pair from an adjacent pad pair is reduced without increasing the pitch or the PCB size.

As noted above, in implementations of the subject matter of this disclosure, the differential signal pad pairs of a given linear arrangement are offset from the differential signal pad pairs of an adjacent linear arrangement. Specifically, a line extending from the midpoint of a differential signal pad pair of a first linear arrangement, normal to the line along which an adjacent linear arrangement extends, intersects the line along which the adjacent linear arrangement extends intermediate of two differential signal pad pairs of the adjacent linear arrangement. In some embodiments, the intersection is halfway between the two differential signal pad pairs of the adjacent linear arrangement. Such an arrangement has been found to provide effective shielding of differential signal traces and signal vias, without adversely affecting pad pitch or the size of the PCB.

In accordance with other implementations of the subject matter of this disclosure, the printed circuit board may also include a pattern of ground pads between certain differential signal pad pairs to shield against cross-talk between those differential signal pad pairs. The addition of ground pads may provide electromagnetic shielding of each pad pair from adjacent pad pairs. In some implementations, the addition of ground pads may provide electromagnetic shielding of each differential signal pad pair in at least two spatial axes. In some implementations, the arrangement of ground pads includes a first subset of ground pads. Each ground pad in the first subset of ground pads is positioned between adjacent differential signal pad pairs within each linear arrangement of differential signal pad pairs. In some implementations, a ground pad in the first subset of ground pads is positioned halfway between adjacent differential signal pad pairs within each linear arrangement of differential signal pad pairs. Additionally, a second subset of ground pads are distributed along a ground pad line that is parallel to the lines along which the linear arrangements of differential signal pads are distributed. The arrangement of differential signal pad pairs and ground pads may be repeated. For example, there may be multiple linear arrangements of differential signal pad pairs alternating with linear arrangements of ground pads.

In accordance with some implementations of the subject matter of this disclosure, the arrangement of pad pairs on the PCB may be positioned for receiving the corresponding plurality of differential signal pins and plurality of ground pins of an integrated circuit device or the pins of an additional printed circuit board.

According to further implementations of the subject matter of this disclosure, the ground vias may be arranged to provide trace layout corridors, which may be referred to as lanes, to further minimize the crosstalk between differential signal traces and adjacent signal-carrying structures including differential signal pads and signal vias. More specifically, a lane is a section of the PCB, between adjacent linear arrangements, that is left empty of ground vias, signal vias, or anti-pads. The lanes are parallel to the linear arrangements of differential signal pad pairs and are used for the routing of differential signal traces. In some implementations, each lane encompasses multiple layers, providing a space reserved for the routing not only of differential signal traces that are confined to individual layers of the PCB, but also differential signal traces that transition (e.g., by way of vias) from one layer of the PCB to another layer of the PCB. Because ground vias border each lane, each lane is a shielded corridor in which cross-talk between differential signal traces in the corridor and nearby signal-carrying structures is reduced.

The subject matter of this disclosure may be better understood by reference to FIGS. 1-7.

Figure 1:
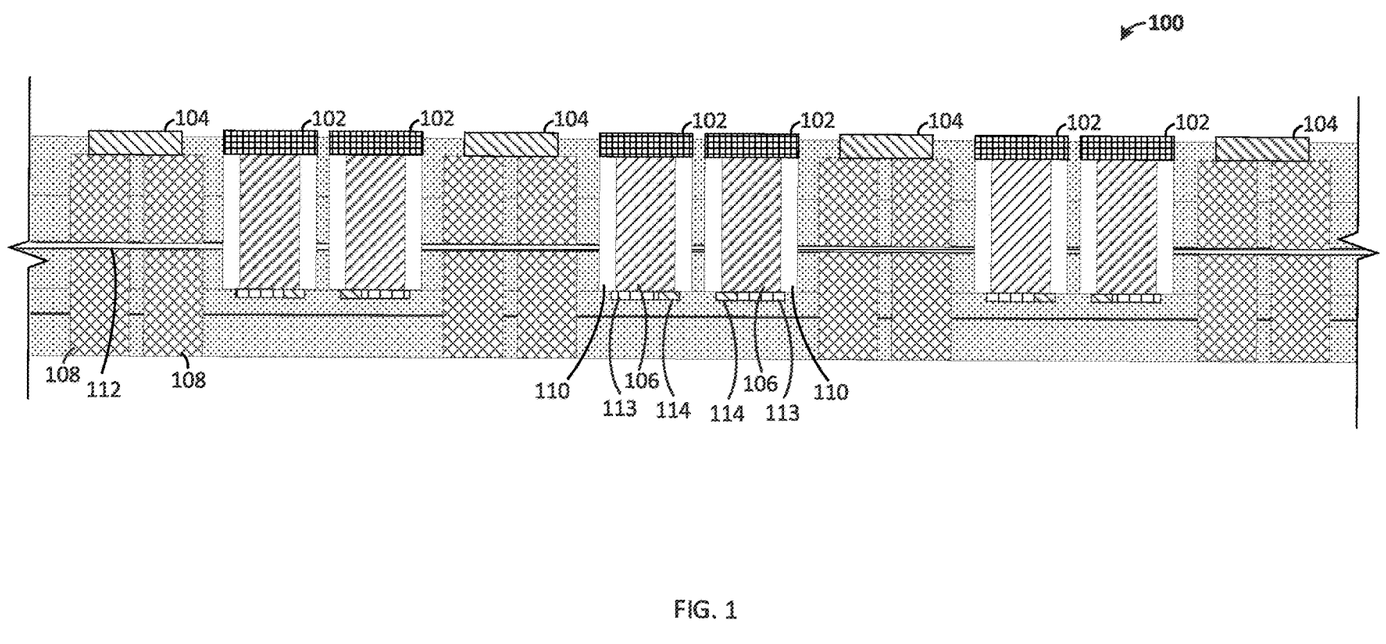
FIG. 1 is a cross-sectional view of a printed circuit board taken from line 1-1 of FIG. 7, in accordance with implementations of the subject matter of this disclosure.

FIG. 1 is a cross-sectional view of a printed circuit board 100, in accordance with implementations of the subject matter of this disclosure. Printed circuit board (PCB) 100 includes differential signal pads 102 and ground pads 104. Differential signal pads 102 and ground pads 104 are configured to electrically couple to pins of an integrated circuit device or pins of additional circuit boards. The pins of the integrated circuit device and the pins of the additional circuit boards may refer to land, ball, or pin pinout connections. These pins are arranged on the integrated circuit device or additional circuit board in the same pattern as the arrangement of differential signal pads 102 and ground pads 104 on the printed circuit board 100. According to implementations of the subject matter of this disclosure, printed circuit board 100 further includes signal vias 106, ground vias 108, anti-pads 110, a board ground layer 112, a signal via pad 113 and differential signal traces 114, all of which are positioned in various layers of the PCB 100. In some embodiments, the differential signal pads 102 are grouped into differential signal pad pairs, each of which includes a positive signal pad and a negative signal pad.

In some implementations, the signal vias 106 are pairs of a positive signal via and a negative signal via. Each of the signal vias 106 may be electrically coupled to a respective differential signal trace 114 by way of the signal via pad 113. The differential signal traces 114 include a positive signal trace, which carries a signal that is transmitted from the positive signal pad to a corresponding negative pin of a device, and a negative signal trace, which carries a signal that originates at a positive pin of the device. Additionally, the printed circuit board 100 may also include a board ground layer 112. In some implementations, the ground vias 108 may be electrically coupled to a ground of the circuit board (e.g., a ground layer 112).

In addition, in some implementations, anti-pads 110, which are empty non-conductive pockets in a layer or layers of the printed circuit board 100, may be provided surrounding one or more of the signal vias 106. In some implementations, the positive signal pads 102 or the negative signal pads 102 may be electrically coupled to the positive signal via 106 or the negative signal via 106, respectively, and the ground pads 104 may be electrically coupled to the ground vias 108.

Figure 2:
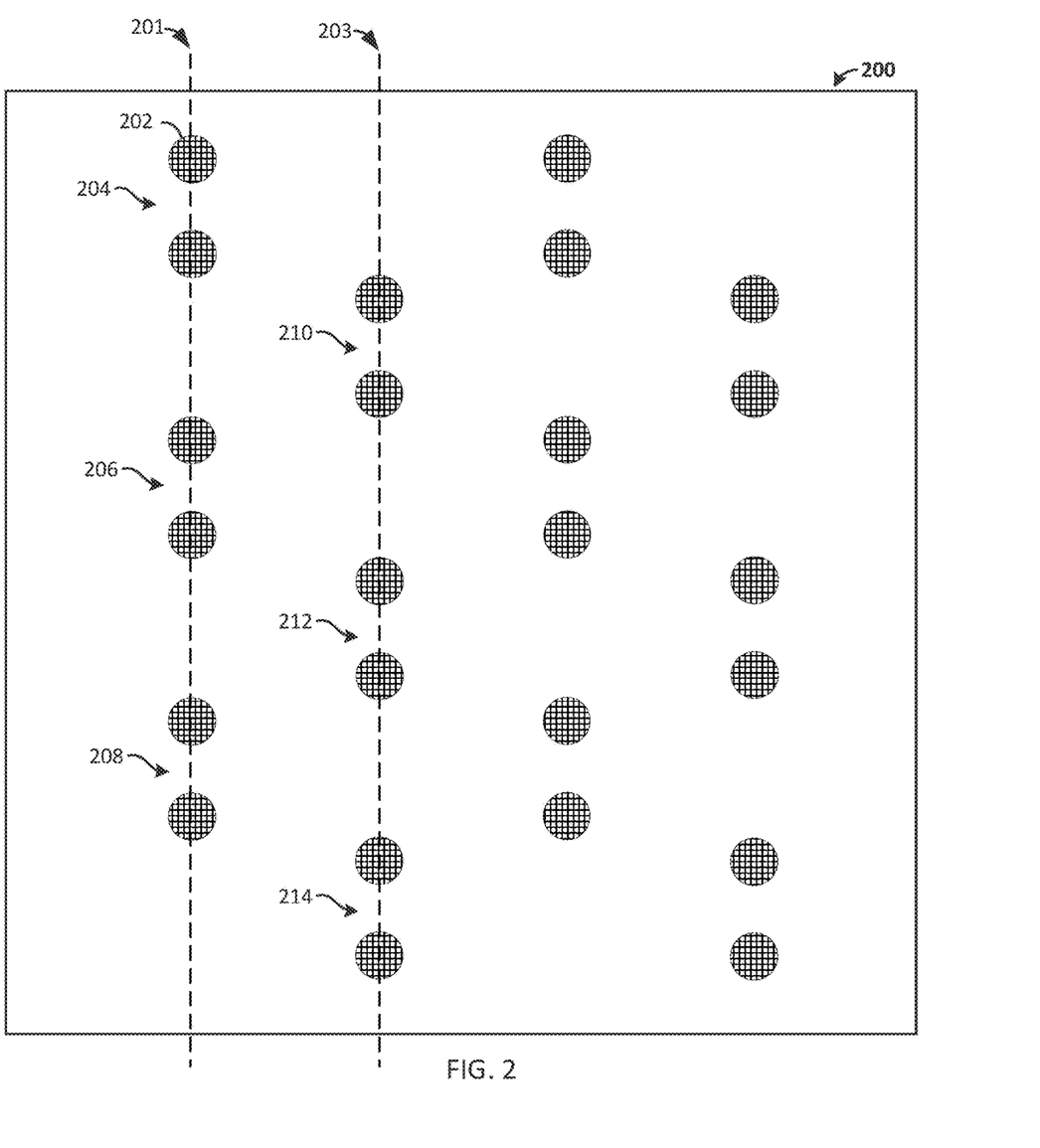
FIG. 2 is a simplified plan view of differential signal pad pairs on a printed circuit board, arranged in a pad pattern in accordance with implementations of the subject matter of this disclosure.

FIG. 2 is a simplified plan view of differential signal pad pairs (i.e., 204, 206, 208, 210, 212, 214) on a printed circuit board 200, arranged in a pattern of differential signal pads 202. In some implementations the differential signal pad pair pattern includes a first linear arrangement of differential signal pad pairs (i.e., 204, 206, 208) distributed along a first line 201 and a second linear arrangement of differential signal pad pairs (i.e., 210, 212, 214) distributed along a second line 203 that is parallel to the first line 201. These differential signal pad pairs are arranged along a respective line in an orientation such that a line connecting the centers of each differential signal pad 202 in a differential signal pad pair is coincident with the respective line along which that differential signal pad pair is positioned. The pad pairs are uniformly distributed along the respective first line 201 and second line 203. That is, defining the halfway point along a line connecting the centers of the two differential signal pads 202 in a differential signal pad pair as the "midpoint" of the differential signal pad pair, the distance from the midpoint of any differential signal pad pair along a respective one of the first line 201 and second line 203 to either one of the adjacent differential signal pad pairs along that respective one of the first line 201 and second line 203 is the same.

In some embodiments, the printed circuit board 200 includes multiple linear arrangements of differential signal pad pairs, each linear arrangement being distributed along its own respective line. The lines associated with each linear arrangements of differential signal pad pairs are parallel to each other and spaced apart by a uniform line-to-line pitch. The differential signal pad pairs of the second linear arrangement are positioned along the second line 203, with the differential signal pad pairs being offset from the differential signal pad pairs of the first linear arrangement. That is, in some embodiments, a line extending from the midpoint of a differential signal pad pair of the second linear arrangement normal to the first line 201 intersects the first line 201 halfway between two differential signal pad pairs of the first linear arrangement.

In some embodiments, a third linear arrangement of differential signal pad pairs is uniformly distributed along a third line, the pair-to-pair pitch separating two adjacent differential signal pad pairs along each line is uniform, and the differential signal pad pair pitch between the signal pads within a differential signal pad pair is uniform for each linear arrangement of differential signal pad pairs. In some embodiments, the differential signal pad pairs of the third linear arrangement of differential signal pad pairs are positioned such that a line extending from the midpoint of a differential signal pad pair of the third linear arrangement normal to the first line 201 intersects the midpoint of a differential signal pad pair of the first linear arrangement. Any number of additional parallel linear arrangements of differential signal pad pairs meeting the conditions set forth above may be provided. That is, for any additional linear arrangement of differential signal pad pairs distributed along an additional line, the differential signal pad pairs in the additional linear arrangements are positioned such that a line drawn from the midpoint of each pair of signal pads in the linear arrangement, normal to a line along which an adjacent linear arrangement of differential signal pad pairs is distributed, intersects that line in the adjacent linear arrangement of differential signal pad pairs halfway between two differential signal pad pairs of the adjacent linear arrangement of differential signal pad pairs.

Figure 3:
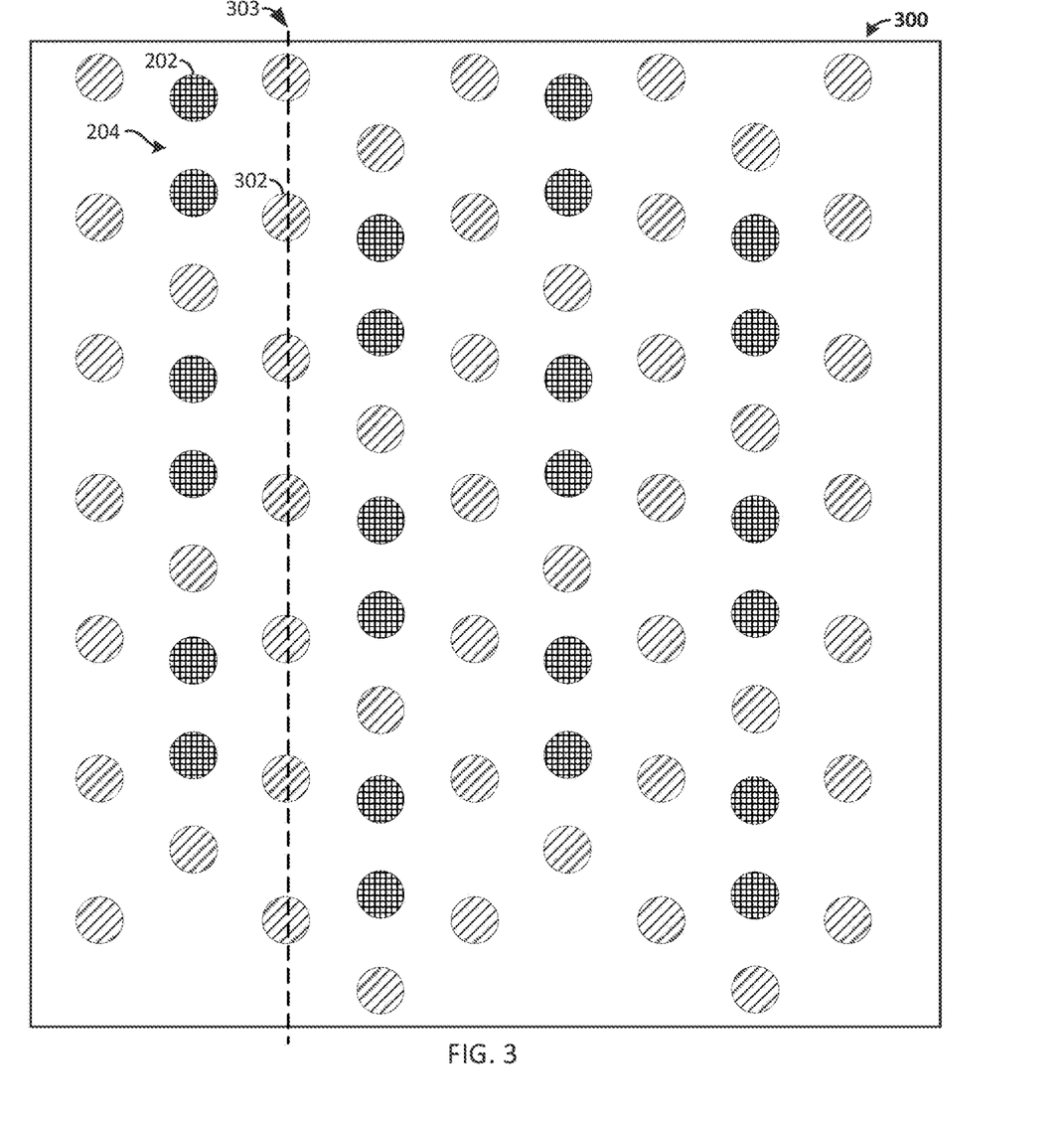
FIG. 3 shows another plan view of a differential signal pad pairs and ground pads on a printed circuit board, arranged in a pad pattern in accordance with implementations of the subject matter of this disclosure.

FIG. 3 shows another plan view of a differential signal pad pairs (i.e., 204) and ground pads 302 on a printed circuit board 300, arranged in a pad pattern according to the subject matter of the present disclosure. The printed circuit board 300 shows the differential signal pad pairs along each of the linear arrangements of differential signal pad pairs. In addition, ground pads 302 are positioned on the printed circuit board 300, similarly to the differential signal pads 202. In some embodiments, the printed circuit board 300 is configured similarly to the printed circuit board 100 shown in FIG. 1. At least some of the ground pads 302 are positioned between adjacent differential signal pad pairs in order for the ground pads to provide shielding against cross-talk for each of the differential signal pad pairs. Each of the ground pads 302 is electrically coupled to a circuit board ground 112. Each of the ground pads 302 is electrically coupled to ground vias 108. The differential signal pads 202 and the ground pads 302 are electrically coupled to components within layers of a mounted integrated circuit device on the printed circuit board 300. In some embodiments, the plurality of ground pads 302 includes a first subset of ground pads 302 in which for each linear arrangement of differential signal pad pairs a ground pad 302 is positioned halfway between adjacent differential signal pad pairs. In some embodiments, additionally, ground pads 302 are distributed along a ground pad line 303 that is parallel to the lines along which the linear arrangements of signal pads 202 are distributed. In some embodiments, the ground pads 302 distributed along the ground pad line 303 are positioned along a line drawn from a midpoint of a given differential signal pad pair and the midpoint of the closest neighboring differential signal pad pair of an adjacent linear arrangement of differential signal pad pairs. In some embodiments, the ground pads 302 are distributed along the ground pad line 303 are positioned halfway along the line drawn from the midpoint of the given differential signal pad pair and the midpoint of the closest neighboring differential signal pad pair of the adjacent linear arrangement of differential signal pad pairs. The ground pads 302 along the ground pad line 303 are positioned such that a line drawn from the midpoint of the given differential signal pad pair 204 to the midpoint of the closest neighboring differential signal pad pair of an adjacent linear arrangement of signal pad pairs intersects the centerpoint of a ground pad 302.

Figure 4:
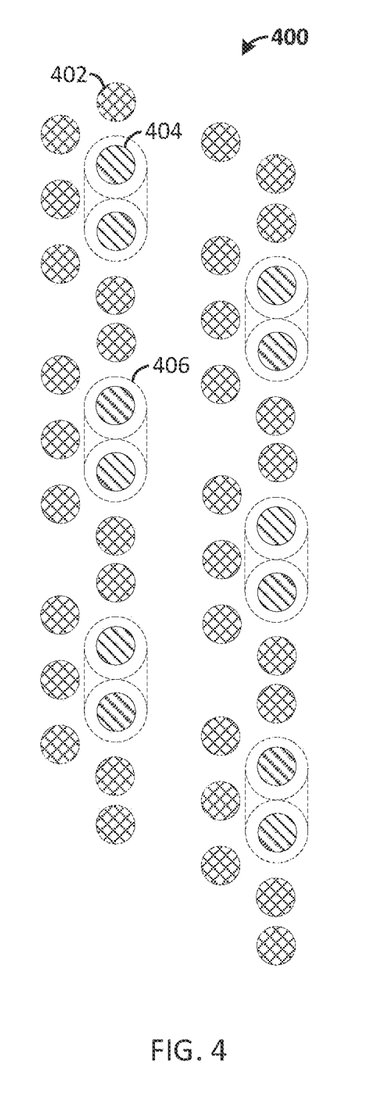
FIG. 4 shows a partial plan view of a layout of signal vias, ground vias and anti-pads in a printed circuit board, according to some implementations of the subject matter of this disclosure.

FIG. 4 shows a partial plan view of a layout 400 of signal vias 404, ground vias 402 and anti-pads 406 in a printed circuit board, according to some implementations of the subject matter of this disclosure. The printed circuit board includes a plurality of signal vias 404, a plurality of ground vias 402, and a plurality of anti-pads 406. The vias 402, 404 may be configured to electrically couple the pads 202, 302 to other electrical components on the printed circuit board. Specifically, in some embodiments, the ground vias 402 are electrically coupled to the ground pads 302 and also to the circuit board ground 112, which may be an internal layer within the printed circuit board. In addition, the signal vias 404 may be electrically coupled to the signal pads 202. Signal vias 404 are arranged in pairs, similarly to the differential signal pad pairs 204. In each pair of signal vias 404, there is one positive signal via, and one negative signal via. For each pair of signal vias 404, the positive signal via is electrically coupled to a positive signal pad and the negative signal via is electrically coupled to a negative signal pad. Within the printed circuit board layer in which the signal vias 404 are located, the positive and negative signal vias may cause cross-talk interference with another pair of signal vias 404 depending on the location of the differential signal pad pairs. In some implementations, there may be anti-pads 406, or empty non-conductive pockets within the circuit board layer in order to electrically isolate each of the signal vias 404 within a signal via pair. In some implementations, for each linear arrangement of differential signal pad pairs at least one of the ground vias 402 is positioned between adjacent differential signal pad pairs. Additionally, for each respective line, at least one ground via 402 is positioned between the respective line and a first adjacent line to provide shielding for the signal vias 404 positioned along the respective line. A section of the PCB, between the respective line and a second adjacent line, parallel to the first adjacent line, left empty of ground vias 402, signal vias 404 or anti-pads 106 in order to provide lanes, parallel to the linear arrangements of differential signal pad pairs, for routing of differential signal traces. In some implementations, the lanes are provided between a linear arrangement of differential signal pad pairs and an adjacent linear arrangement of ground pads. In some implementations, each lane is a multi-layer space reserved for differential signal trace pair routing as described below. That is, in those implementations, each lane across the layers of the PCB, accommodating differential signal traces that are confined to individual layers, each differential signal trace pair electromagnetically separated by a ground layer of the PCB.

Figure 5:
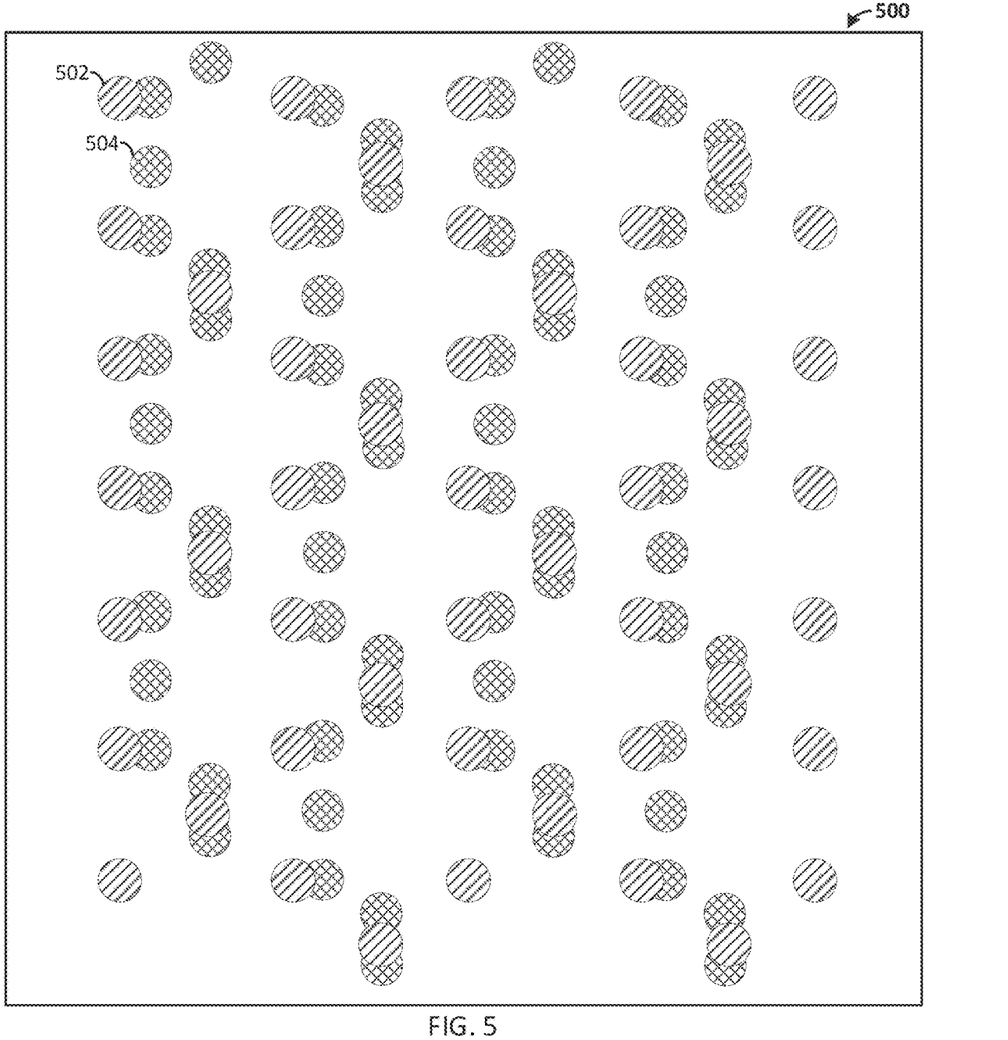
FIG. 5 shows a plan view of a layout of ground pads on a printed circuit board and ground vias in the printed circuit board, according to some implementation of the subject matter of this disclosure.

FIG. 5 shows a plan view of a layout of ground pads 502 on a printed circuit board and ground vias 504 in the printed circuit board 500, according to some implementations of the subject matter of this disclosure. Each ground pad 502 is electrically coupled to at least one ground via 504. In some embodiments, there may be ground vias 504 that are not electrically coupled to a ground pad 502. However, each ground via 504 is electrically coupled to a ground layer of the printed circuit board 500, and therefore the ground vias 504 that are not connected to a ground pad 502 provide shielding against signal cross-talk within the layers of the PCB 500 between signal via pairs. In some embodiments, ground vias 504, may be electrically coupled to a ground pad 502 by an interconnection on the surface of the PCB.

Figure 6:
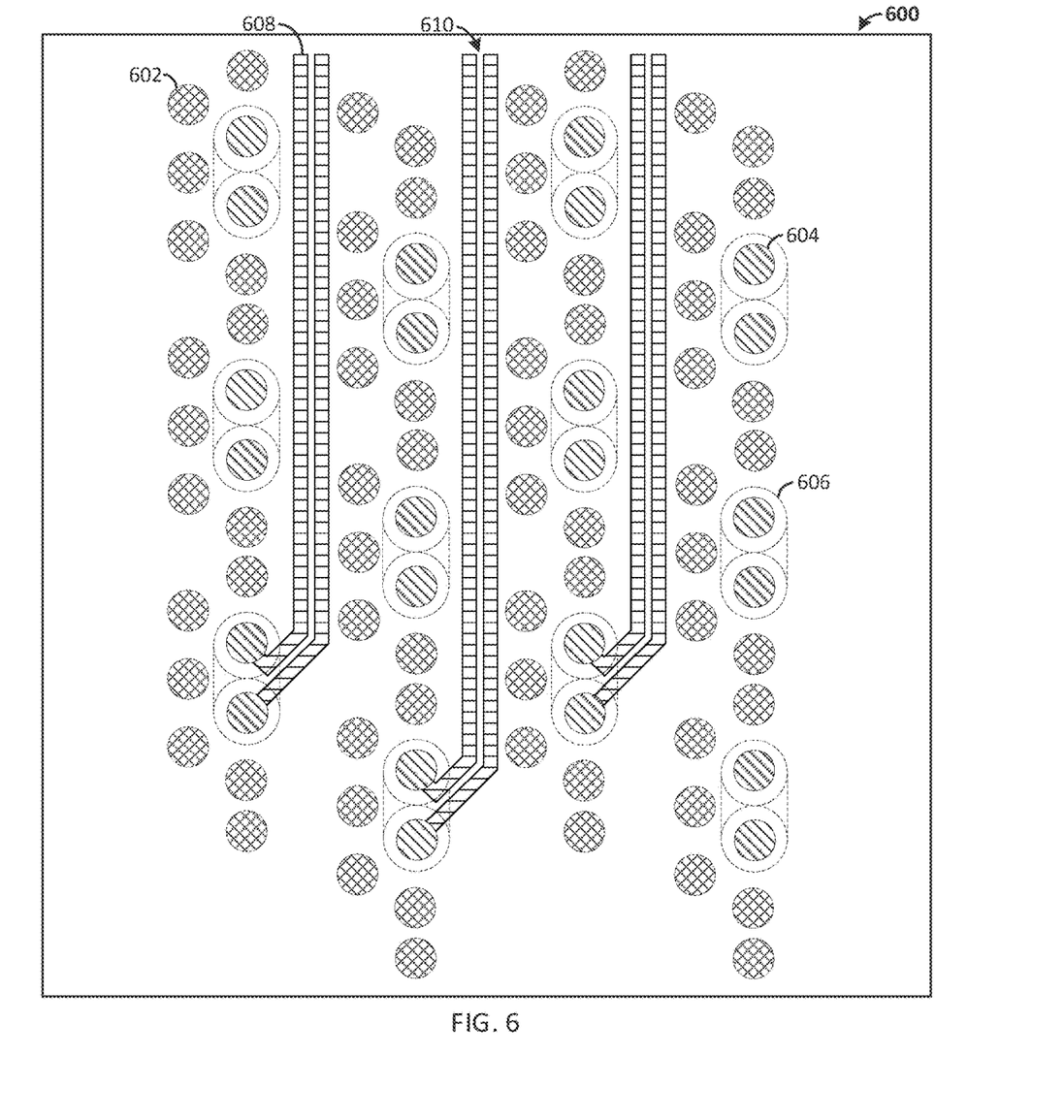
FIG. 6 is a plan view including differential signal traces routed in layers of the printed circuit board, according to some implementations of the subject matter of this disclosure.

FIG. 6 is a plan view including signal traces 608 routed along a signal layer of the printed circuit board 600, according to some implementations of the subject matter of this disclosure. In some implementations, signal traces 608 are arranged into differential signal trace pairs 610. Each differential signal trace pair 610 includes a positive signal trace and a negative signal trace. In some implementations, the ground vias 602 are positioned to provide shielding of each pair of signal vias from other neighboring signal via pairs. The ground vias 602 and signal vias 604 are arranged to provide a lane, parallel to the linear arrangements of differential signal pad pairs, along which differential signal trace pairs 610 may be routed. In some embodiments, the lanes provided by the ground vias 602 and signal vias 604 are shown in FIG. 4 with ground vias 402 and signal vias 404. In some embodiments, each pair of signal vias along a linear arrangement of differential signal pad pairs is electrically coupled to the same differential signal trace pair 610, with each positive signal via being electrically coupled to the positive signal trace and each negative signal via being electrically coupled to the negative signal trace. In some embodiments, multiple differential signal trace pairs 610 are routed along the same lane spacing in different layers of the PCB 600. Therefore, along the same lane of space, there may be multiple differential signal trace pairs 610 that are stacked parallel to each other, routed in layers that are parallel to the surface layer wherein the signal pads and ground pads are located. In this implementation, each pair of signal traces 608 is electrically coupled to a different signal via pair and the differential signal trace pairs may be electromagnetically separated by a ground layer of the PCB.

Figure 7:
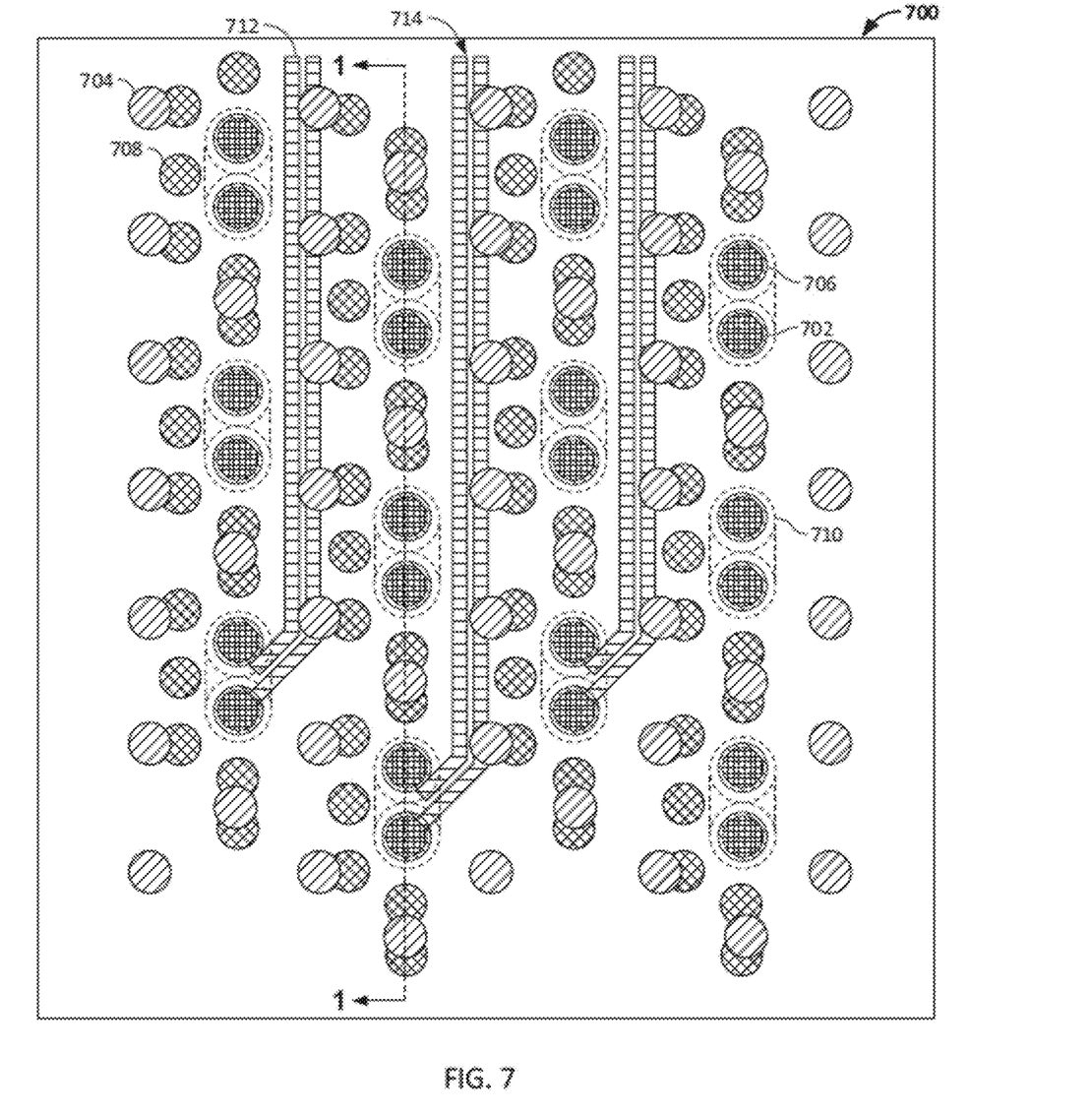
FIG. 7 is a multi-layer overlay view of a printed circuit board according to some implementations of the subject matter of this disclosure.

FIG. 7 is a multi-layer overlay view of a printed circuit board 700 according to some implementations of the subject matter of this disclosure, in which certain depicted elements are in layers behind the layer being viewed. In some implementations, the signal pads 702 and ground pads 704 are configured to receive an integrated circuit device or additional circuit board with corresponding connection signal pins and ground pins that match the pad arrangement of the printed circuit board 700. The printed circuit board 700 includes a plurality of signal vias 706, a plurality of ground vias 708, a plurality of anti-pads 710, and a plurality of signal traces 712. In some implementations, signal traces 712 are arranged into differential signal trace pairs 714. The signal traces 712 and grouped differential signal trace pairs 714 may have the same features, arrangement, and positioning as signal traces 608 and differential signal trace pairs 610, respectively. The vias 706, 708 electrically couple the pads 702, 704 to signal traces 712 routed within the printed circuit board 700. Specifically, in some embodiments, the ground vias 708 are electrically coupled to the ground pads 704 and also to the circuit board ground 112, which may be an internal layer within the printed circuit board. In addition, the signal vias 706 may be electrically coupled to the signal pads 702. These signal vias 706 are arranged in pairs, similarly to the differential signal pad pairs. In some implementations, the differential signal pad pairs may correspond to the differential signal pad pairs 204 in FIG. 2. In each pair of signal vias 706, there is one positive signal via and one negative signal via, each for the respective positive and negative signal pad, respectively.

Thus it is seen that a pad arrangement including signal pads and ground pads on a printed circuit board (PCB) that uses differential signals with a data rate of 100GBps or greater and a circuit board constraint may be used to shield against cross-talk. Therefore, a printed circuit board that lowers cross-talk between pads of differential signal pad pairs has been provided.

As used herein and in the claims, which follow, the construction "one of A and B" shall mean "A or B."

It is noted that the foregoing is only illustrative of the principles of the invention, and that the invention can 5 be practiced by other than the described embodiments, which are presented for purposes of illustration and not of limitation, and the present invention is limited only by the claims which follow.

What is claimed is:

1. A printed circuit board having a major plane, the printed circuit board comprising:
   a first plurality of signal pads, each signal pad in the first plurality of signal pads being on a surface of the printed circuit board that is parallel to the major plane, the first plurality of signal pads being grouped into a second plurality of differential signal pad pairs, wherein each respective differential signal pad pair defines a midpoint that is located halfway between centers of the signal pads of the respective differential signal pad pair;

a first differential signal pad pair positioned on a first line, wherein a line drawn between the centers of the signal pads of the first differential signal pad pair is coincident with the first line;
a second differential signal pad pair positioned on a second line parallel to the first line, wherein a line drawn between the centers of the signal pads of the second differential signal pad pair is coincident with the second line, wherein:
the second differential signal pad pair is offset from the first differential signal pad, and
a line drawn normal to the first line and extending from a midpoint of the second differential signal pad pair does not intersect the first line at a midpoint of the first differential signal pad pair;
a plurality of ground pads on the surface of the printed circuit board, wherein a first subset of the plurality of ground pads are distributed along a ground pad line that is parallel to the first line and positioned between the first line and the second line; and
at least one of the ground pads is positioned along a line drawn from the midpoint of the first differential signal pad pair and the midpoint of the second differential signal pad pair.

2. The printed circuit board of claim 1, wherein:
the ground pad line is positioned halfway between the first line and the second line; and
the at least one of the ground pads is positioned halfway along the line drawn from the midpoint of the first differential signal pad pair and the midpoint of the second differential signal pad pair.

3. The printed circuit board of claim 1, wherein:
the second plurality of differential signal pad pairs includes:
a first linear arrangement of differential signal pad pairs, including the first differential signal pad pair, distributed along the first line; and
a second linear arrangement of differential signal pad pairs, including the second differential signal pad pair, distributed along the second line;
in the first linear arrangement, differential signal pad pairs are uniformly distributed along the first line, adjacent differential signal pad pairs of the first linear arrangement of differential signal pad pairs being separated by a first pair-to-pair pitch measured between midpoints of the adjacent differential signal pad pairs of the first linear arrangement of differential signal pad pairs; and
in the second linear arrangement, differential signal pad pairs are uniformly distributed along the second line, adjacent differential signal pad pairs of the second linear arrangement of differential signal pad pairs being separated by a second pair-to-pair pitch measured between midpoints of adjacent differential signal pad pairs of the second arrangement of differential signal pad pairs, wherein the second pair-to-pair pitch is the same as the first pair-to-pair pitch.

4. The printed circuit board of claim 3, wherein:
the differential signal pad pairs of the second linear arrangement are offset from the differential signal pad pairs of the first linear arrangement, wherein a line drawn normal to the first line and extending from the midpoint of a differential signal pad pair of the second linear arrangement intersects the first line halfway between two differential signal pad pairs.

5. The printed circuit board of claim 4, wherein:
each differential signal pad pair in the second plurality of differential signal pad pairs comprises:
a positive signal pad; and
a negative signal pad.

6. The printed circuit board of claim 5, further comprising:
a plurality of signal via pairs, each signal via pair including a positive signal via and a negative signal via, the plurality of signal via pairs separated from at least one layer of the printed circuit board by a plurality of via anti-pads.

7. The printed circuit board of claim 6, wherein:
the positive signal pad of the at least one of the second plurality of differential signal pad pairs is electrically coupled to the positive signal via of the at least one plurality of signal via pairs; and
the negative signal pad of the at least one of the second plurality of differential signal pad pairs is electrically coupled to the negative signal via of the at least one plurality of signal via pairs.

8. The printed circuit board of claim 6, further comprising a plurality of differential signal trace pairs, routed in at least one plane parallel to the major plane, wherein each differential signal trace pair in the plurality of differential signal trace pairs comprises:
a positive signal trace; and
a negative signal trace.

9. The printed circuit board of claim 8, wherein:
for each respective differential signal pad pair in the second plurality of differential signal pad pairs, the positive signal pad is electrically coupled to the positive signal trace of a corresponding differential signal trace pair of the plurality of differential signal trace pairs by a positive signal via; and
for each respective differential signal pad pair in the second plurality of differential signal pad pairs the negative signal pad is electrically coupled to the negative signal trace of a corresponding differential signal trace pair of the plurality of differential signal trace pairs by a negative signal via.

10. The printed circuit board of claim 4, wherein:
each of the signal pads is one of a signal land or a plated signal through-hole; and
each of the ground pads is one of a ground land or a plated ground through-hole.

11. The printed circuit board of claim 10, wherein the second plurality of differential signal pad pairs further comprises a third linear arrangement of differential signal pad pairs distributed along a third line parallel to the first line and the second line, the differential signal pad pairs in the third linear arrangement of differential signal pad pairs being uniformly distributed wherein a respective line drawn normal to the first line from a midpoint of a respective differential signal pad pair of the third linear arrangement intersects with a midpoint of a respective differential signal pad pair of the first linear arrangement of differential signal pad pairs.

12. The printed circuit board of claim 11, further comprising additional linear arrangements of differential signal pad pairs, wherein:
each additional linear arrangement of differential signal pad pairs is distributed along an additional line; and
for each respective additional linear arrangement, the differential signal pad pairs in that respective additional arrangement are positioned wherein a respective line drawn from the midpoint of a respective differential signal pad pair of the respective additional linear arrangement, normal to a line along which an adjacent linear arrangement of differential signal pad pairs is distributed intersects with the line, along which the adjacent linear arrangement of differential signal pad pairs is distributed, halfway between two differential signal pad pairs of the adjacent linear arrangement of differential signal pad pairs.

13. The printed circuit board of claim 4, wherein the plurality of ground pads further comprises a subset of the plurality of ground pads, each ground pad of the subset being positioned halfway between the differential signal pad pairs of one of the linear arrangements of differential signal pad pairs.

14. The printed circuit board of claim 13, wherein ground pads in the plurality of ground pads surround each of the differential signal pad pairs in at least two spatial axes to shield against cross-talk between neighboring differential signal pad pairs.

15. The printed circuit board of claim 14, further comprising a plurality of ground vias electrically coupled to a ground layer of the printed circuit board, wherein:

at least one of the plurality of ground pads is electrically coupled to at least one of the plurality of ground vias.

16. The printed circuit board of claim 15, wherein:

for a respective linear arrangement of differential signal pad pairs, at least a first one of the plurality of ground vias is positioned between two adjacent differential signal pad pairs in the respective linear arrangement of differential signal pad pairs, and;

at least a second one of the plurality of ground vias is positioned between two adjacent linear arrangements of differential signal pad pairs; the printed circuit board further comprising:

differential signal traces routed through a lane provided by spacing between a linear arrangement of differential signal pad pairs and an adjacent linear arrangement of ground pads, parallel to the first line.

* * * * *